United States Patent
Yang et al.

(10) Patent No.: US 9,526,178 B2
(45) Date of Patent: Dec. 20, 2016

(54) PRINTED CIRCUIT BOARD METHOD

(71) Applicant: Huawei Technologies Co., Ltd., Shenzhen, Guangdong (CN)

(72) Inventors: Yongxing Yang, Shenzhen (CN); Feng Gao, Shenzhen (CN); Mingli Huang, Shenzhen (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 14/519,677

(22) Filed: Oct. 21, 2014

(65) Prior Publication Data

US 2015/0047892 A1 Feb. 19, 2015

Related U.S. Application Data

(63) Continuation of application No. PCT/CN2014/073252, filed on Mar. 11, 2014.

(30) Foreign Application Priority Data

Aug. 15, 2013 (CN) .......................... 2013 1 0356786

(51) Int. Cl.
*H05K 3/42* (2006.01)
*H05K 3/00* (2006.01)

(52) U.S. Cl.
CPC ............. *H05K 3/0047* (2013.01); *H05K 3/429* (2013.01); *H05K 2201/09545* (2013.01); *H05K 2203/0207* (2013.01); *Y10T 29/49156* (2015.01)

(58) Field of Classification Search
CPC ...... H05K 1/115; H05K 3/0047; H05K 3/429; H05K 2201/09545; H05K 2203/0207; Y10T 29/49156
See application file for complete search history.

(56) References Cited

U.S. PATENT DOCUMENTS

| | | | |
|---|---|---|---|
| 6,388,208 B1 * | 5/2002 | Kiani | H05K 1/0222 174/260 |
| 7,669,321 B1 | 3/2010 | Levy et al. | |
| 8,212,153 B2 * | 7/2012 | Matsui | H05K 1/115 174/262 |
| 2005/0128672 A1 | 6/2005 | Tourne et al. | |
| 2008/0314625 A1 | 12/2008 | Hamada et al. | |
| 2012/0302075 A1 | 11/2012 | Muraoka et al. | |

FOREIGN PATENT DOCUMENTS

| | | |
|---|---|---|
| CN | 1787726 A | 6/2006 |
| CN | 101094562 A | 12/2007 |
| CN | 101330804 A | 12/2008 |
| CN | 102883522 A | 1/2013 |
| CN | 103442528 A | 12/2013 |

* cited by examiner

Primary Examiner — Carl Arbes

(57) ABSTRACT

A printed circuit board (PCB) backdrilling method is disclosed, where a conductive layer is disposed between a surface of a PCB on an intended-for-backdrilling side of a plated through hole (PTH) and a target signal layer of the PCB, and the method includes: performing a first backdrilling on the PTH with a first preset depth starting from the surface of the PCB; controlling the backdrill bit to move along the drill hole formed in the first backdrilling toward the target signal layer; and when the backdrill bit is in contact with the conductive layer, completing a second backdrilling with a second preset depth starting from the conductive layer.

6 Claims, 2 Drawing Sheets

PRINTED CIRCUIT BOARD METHOD

CROSS-REFERENCE TO RELATED APPLICATIONS

This application is a continuation of International Application No. PCT/CN2014/073252, filed on Mar. 11, 2014, which claims priority to Chinese Patent Application No. 201310356786.6, filed on Aug. 15, 2013, both of which are hereby incorporated by reference in their entireties.

TECHNICAL FIELD

The present invention relates to the field of circuit boards, and in particular, to a PCB backdrilling method and system.

BACKGROUND

A printed circuit board (Printed Circuit Board, PCB) is also called a printing circuit board or a printing line board, and is an important integral part for physical support and signal transmission in an electronic product. A futile stub part that is not used for signal transmission in a plated through hole (Plated through hole, PTH) in a PCB board aggravates a signal transmission loss in the PCB, or even impairs integrity of signal transmission. Therefore, a backdrilling manner is commonly used in the industry to minimize a length of the stub part in the PTH, so as to mitigate impact caused by the stub part on the signal transmission of the PCB. It is a key indicator for measuring backdrilling performance to make the length of the futile stub or the distance from an outmost side of the futile stub to a signal layer as short as possible while it is not allowed to drill through the signal layer.

A general practice of backdrilling in the prior art is to preset a backdrilling depth according to different PCBs and different working types, and then perform a backdrilling operation according to the preset depth. Controlling the backdrilling depth is already mature, which is primarily implemented in two manners: One manner is to control a depth by means of pressure sensing, and the other manner is to control a depth by means of electric current sensing. Either of both manners can achieve precision that allows for an error of within 2 mils (a mil is one thousandth of an inch). However, in practical work, due to different processing precision of PCB materials, for a same PCB processing material number, the thickness in the same location of the same type of PCBs of a same batch even varies. That is, a certain thickness tolerance exists. The thickness tolerance is in a proportional relationship with a total thickness of a PCB. A thicker PCB corresponds to a larger thickness tolerance. If backdrilling with a same preset depth is used for a same location of a same type of PCBs, different results are surely to be obtained due to different thicknesses of the PCBs. For a PCB thinner than a standard thickness, the signal layer may be drilled through, and the PCB may become a faulty board; and, for a PCB thicker than the standard thickness, a futile stub that remains after the backdrilling is far larger than a target length, and such a PCB incurs large signal transmission loss while working, or even impairs transmission integrity. Therefore, a primary issue that affects backdrilling precision at present is the PCB thickness deviation, and how to eliminate impact caused by the PCB thickness deviation on backdrilling precision is currently a difficult problem to tackle.

SUMMARY

To solve the foregoing technical problem of impact caused by a thickness deviation of a PCB on backdrilling precision, the present invention provides a PCB backdrilling method and system.

Embodiments of the present invention disclose the following technical solutions:

According to a first aspect, the present invention provides a PCB backdrilling method, where a conductive layer is disposed between a surface of a printed circuit board PCB on an intended-for-backdrilling side of a plated through hole PTH and a target signal layer of the PCB, the conductive layer is connected to the PTH, and the target signal layer is a signal layer corresponding to a current backdrilling task, and the method includes:

performing a first backdrilling on the PTH with a first preset depth starting from the surface of the PCB on the intended-for-backdrilling side of the PTH, so that a drill hole formed in the first backdrilling passes through the conductive layer and does not pass through the target signal layer;

after completion of the first backdrilling, withdrawing a backdrill bit until the backdrill bit is electrically disconnected from the conductive layer;

controlling the backdrill bit to move along the drill hole formed in the first backdrilling toward the target signal layer, and detecting whether the backdrill bit is in contact with the conductive layer; and when the backdrill bit is in contact with the conductive layer, completing a second backdrilling with a second preset depth starting from the conductive layer, so that the target signal layer is not trilled through in the second backdrilling.

In a second possible implementation manner of the first aspect, the first preset depth is specifically any value that is greater than a sum of a first distance, a thickness tolerance of the first distance, and a backdrilling device tolerance, where the first distance is between a connection location of the conductive layer and the PTH and a connection location of the surface of the PCB and the PTH, but is smaller than a difference between a total distance and a sum of a thickness tolerance of the total distance and the backdrilling device tolerance, where the total distance is between a connection location of the target signal layer and the PTH and the connection location of the surface of the PCB and the PTH.

In a third possible implementation manner of the first aspect, the second preset depth is specifically a result of subtracting a thickness tolerance of a second distance and a backdrilling device tolerance from the second distance, where the second distance is between the connection location of the conductive layer and the PTH and a connection location of the target signal layer and the PTH, and the second distance is at least a sum of a thickness tolerance of a first distance and the backdrilling device tolerance, where the first distance is between the connection location of the conductive layer and the PTH and a connection location of the surface of the PCB and the PTH.

In a fourth possible implementation manner of the first aspect, the conductive layer is specifically a ground layer or a power layer or another signal layer of the PCB.

In a fifth possible implementation manner of the first aspect, the detecting whether the backdrill bit is in contact with the conductive layer is specifically:

when detecting that a conductive loop is formed by the conductive layer, a backdrilling device, and the backdrill bit, determining that the backdrill bit is contact with the conductive layer.

In a sixth possible implementation manner of the first aspect, the performing a first backdrilling on the PTH with a first preset depth starting from the surface of the PCB on the intended-for-backdrilling side of the PTH, specifically includes:

when the backdrill bit is in contact with the surface of the PCB on the intended-for-backdrilling side of the PTH, forming a conductive loop by the surface of the PCB on the intended-for-backdrilling side of the PTH, a backdrilling device and the backdrill bit; and when detecting that the surface of the PCB on the intended-for-backdrilling side of the PTH, the backdrilling device, and the backdrill bit form the conductive loop, completing the first backdrilling on the PTH with the first preset depth starting from the surface of the PCB on the intended-for-backdrilling side of the PTH.

According to a second aspect, the present invention provides a PCB backdrilling system, where a conductive layer is disposed between a surface of a PCB on an intended-for-backdrilling side of a PTH and a target signal layer of the PCB, the conductive layer is connected to the PTH, and the target signal layer is a signal layer corresponding to a current backdrilling task; and the system includes the PCB and a backdrilling device, where:

the PCB includes the PTH, the surface of the PCB on the intended-for-backdrilling side of the PTH, the target signal layer, and the conductive layer;

the surface of the PCB on the intended-for-backdrilling side of the PTH, the target signal layer, and the conductive layer are all connected to the PTH; and the backdrilling device is configured to perform a first backdrilling on the PTH with a first preset depth starting from the surface of the PCB on the intended-for-backdrilling side of the PTH, so that a drill hole formed in the first backdrilling passes through the conductive layer and does not pass through the target signal layer; after completion of the first backdrilling, withdraw a backdrill bit until the backdrill bit is electrically disconnected from the conductive layer; control the backdrill bit to move along the drill hole toward the target signal layer, and detect whether the backdrill bit is in contact with the conductive layer; and when the backdrill bit is in contact with the conductive layer, complete a second backdrilling with a second preset depth starting from the conductive layer, so that the target signal layer is not trilled through in the second backdrilling.

In a second possible implementation manner of the second aspect, the first preset depth is specifically any value that is greater than a sum of a first distance, a thickness tolerance of the first distance, and a backdrilling device tolerance, where the first distance is between a connection location of the conductive layer and the PTH and a connection location of the surface of the PCB and the PTH, but is smaller than a difference between a total distance and a sum of a thickness tolerance of the total distance and the backdrilling device tolerance, where the total distance is between a connection location of the target signal layer and the PTH and the connection location of the surface of the PCB and the PTH.

In a third possible implementation manner of the second aspect, the second preset depth is specifically a result of subtracting a thickness tolerance of a second distance and the backdrilling device tolerance from the second distance, where the second distance is between a connection location of the conductive layer and the PTH and a connection location of the target signal layer and the PTH, and the second distance is at least a sum of a thickness tolerance of a first distance and the backdrilling device tolerance, where the first distance is between the connection location of the conductive layer and the PTH and a connection location of the surface of the PCB and the PTH.

In a fourth possible implementation manner of the second aspect, the conductive layer is specifically a ground layer or a power layer or another signal layer of the PCB.

It can be seen from the foregoing technical solutions that a conductive layer connected to a PTH is disposed in a PCB; when a backdrilling operation is performed on the PTH, a backdrilling is performed twice, where the conductive layer is drilled through but a target signal layer is not drilled through in a first backdrilling, and a second backdrilling is performed toward the target signal layer by starting from the conductive layer that is closer to the target signal layer than the surface of the PCB until the entire backdrilling operation is complete. The backdrilling manner of the two-time backdrilling enables the backdrilling depth in the second backdrilling to be smaller than the backdrilling depth required in an original one-time backdrilling. Therefore, impact on the backdrilling operation caused by a thickness tolerance of the PCB is mitigated, and backdrilling precision of the backdrilling operation is improved.

BRIEF DESCRIPTION OF THE DRAWINGS

To describe the technical solutions in the embodiments of the present invention or in the prior art more clearly, the following briefly introduces the accompanying drawings required for describing the embodiments or the prior art. Apparently, the accompanying drawings in the following description show merely some embodiments of the present invention, and a person of ordinary skill in the art may still derive other drawings from these accompanying drawings without creative efforts.

DETAILED DESCRIPTION

Embodiments of the present invention provide a PCB backdrilling method and system.

To make the foregoing objectives, characteristics, and advantages of the present invention clearer and easier to understand, the following describes the embodiments of the present invention in detail with reference to accompanying drawings.

Embodiment 1

Figure 1:
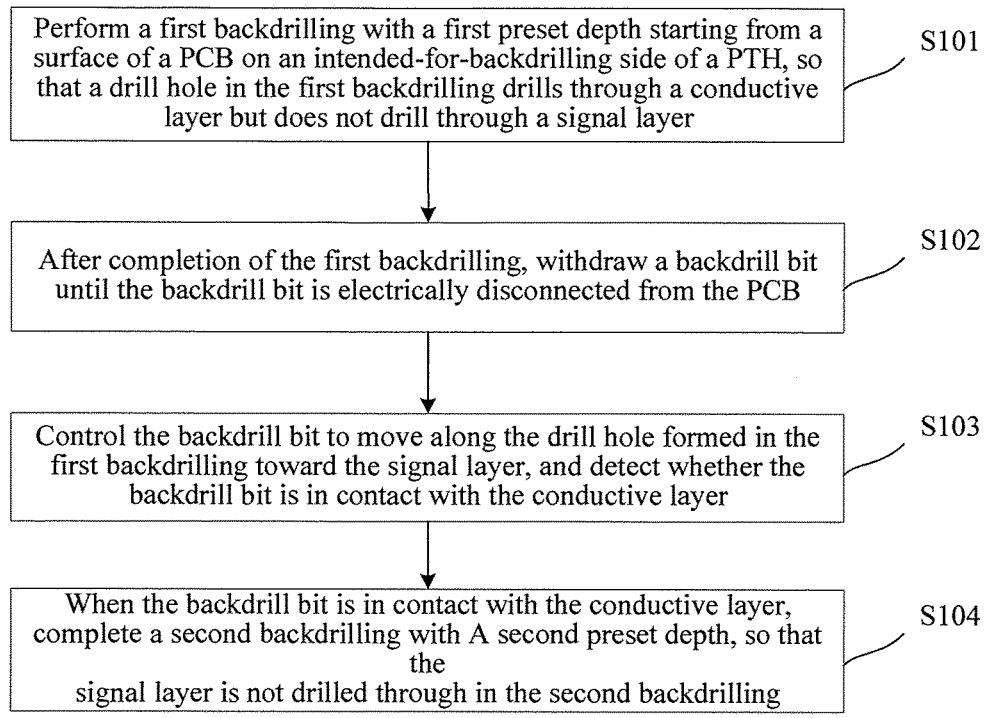
FIG. 1 is a schematic method flowchart of a PCB backdrilling method according to the present invention.

Refer to FIG. 1, which is a schematic method flowchart of a PCB backdrilling method according to the present invention, where a conductive layer is disposed between a surface of a printed circuit board PCB on an intended-for-backdrilling side of a plated through hole PTH and a target signal layer of the PCB, the conductive layer is connected to the PTH, and the target signal layer is a signal layer corresponding to a current backdrilling task, and the method includes the following steps:

Here it should be noted that the PTH of the PCB is a plated through hole on the PCB. Generally, the PTH is connected to at least upper and lower surface copper foils of the PCB and the target signal layer in the PCB. When backdrilling is performed, the backdrilling begins with a PCB side of the PTH. That is, the drilling is from a copper foil on that side to the target signal layer. The target signal layer is emphasized here primarily because the PCB includes multiple signal layers, and, for one PTH, more than one signal layer may be connected to the PTH, however, according to different working design requirements of the PCB, not every signal layer is connected to the PTH. It is possible that a signal layer a is used for one PTH, and a signal layer b is used for another PTH. That is, for different PTHs, different backdrilling tasks exist. For example, when a backdrilling task a is implemented for one PTH, it is required to approach as close as possible and not to drill through the signal layer a. That is, the target signal layer of this backdrilling task is the signal layer a, but signal layers b, c, d, and the like connected to the PTH may be drilled through during a backdrilling process, which, however, does not affect designed functions of the PCB. The backdrilling task is determined as failed only when the target signal layer, that is, the signal layer a, is drilled through.

In the technical solutions of the present invention, when the PCB is processed, a conductive metal layer is disposed between an intended-for-backdrilling side and the target signal layer to demarcate a second backdrilling. The conductive layer may be disposed additionally, or may be an existing metallic conductive layer in the PCB, such as a ground layer or a power layer (Ground/Power layer) or another signal layer in the PCB preferably. That is, the ground layer or power layer or another signal layer that is originally not in connection with the PTH may be set to be in physical connection with the PTH when the PCB is processed; or a signal layer that is already in physical connection with the PTH may also be used as the conductive layer directly.

S101. Perform a first backdrilling with a first preset depth starting from the surface of the PCB on the intended-for-backdrilling side of the PTH, so that a drill hole formed in the first backdrilling passes through the conductive layer and does not pass through the target signal layer.

The first preset depth is not specifically limited herein. However, in order to drill through the conductive layer and stay a certain distance away from the target signal layer, a specific value of the first preset depth needs to be set according to a certain rule or float in a specific range, and other factors such as a thickness tolerance of the PCB and a working tolerance of a backdrilling device used for backdrilling need to be considered additionally. Therefore, a preferred manner of setting the first preset depth is:

preferably, the first preset depth is specifically any value that is greater than a sum of a first distance, a thickness tolerance of the first distance, and the backdrilling device tolerance, where the first distance is between a connection location of the conductive layer and the PTH and a connection location of the surface of the PCB and the PTH, but is smaller than a difference between a total distance and a sum of a thickness tolerance of the total distance and the backdrilling device tolerance, where the total distance is between a connection location of the target signal layer and the PTH and the connection location of the surface of the PCB and the PTH.

The thickness tolerance is in a proportional relationship with a thickness. During a process of processing a PCB, the thickness tolerance of the PCB is generally between +10% and −10% of the thickness. That is, if a standard thickness of the PCB is 100 units, an actual thickness of the processed PCB floats between 90 and 110 units.

It can be seen from the foregoing setting of the range of the first preset depth that the objective of the first backdrilling is to at least drill through the conductive layer but not drill through the target signal layer. Therefore, a minimum settable depth of the first preset depth is that the conductive layer is exactly drilled through. Therefore, the thickness tolerance that needs to be considered here is the thickness tolerance of the thickness between the conductive layer and the surface on the backdrilling side of the PCB, and a maximum depth is that the conductive layer is drilled through and the target signal layer is very near. Therefore, the thickness tolerance that needs to be considered here is the thickness tolerance of the thickness between the target signal layer and the surface on the backdrilling side of the PCB. How to specifically set the first preset depth depends on the backdrilling task or working conditions.

It should be noted that although the first preset depth may be set in a proper range, start time of the first backdrilling, that is, time of starting to calculate the first preset depth, also needs to be determined accurately.

A preferred embodiment solution of this embodiment is: the performing a first backdrilling on the PTH with a first preset depth starting from the surface of the PCB on the intended-for-backdrilling side of the PTH, specifically includes:

when the backdrill bit is in contact with the surface of the PCB on the intended-for-backdrilling side of the PTH, forming a conductive loop by the surface of the PCB on the intended-for-backdrilling side of the PTH, a backdrilling device and the backdrill bit; and when detecting that the surface of the PCB on the intended-for-backdrilling side of the PTH, the backdrilling device, and the backdrill bit form the conductive loop, completing the first backdrilling on the PTH with the first preset depth starting from the surface of the PCB on the intended-for-backdrilling side of the PTH.

First, a structure of the backdrill bit needs to be described. The backdrill bit here is primarily a generic term that includes a drill rod part of a cylinder or another pillar shape used for drilling, and a conic drill tip at the front end of the drill rod or another pointed drill tip. A drill rod diameter of the backdrill bit is larger than a diameter of the PTH. Therefore, in the first backdrilling, a tip part of the backdrill bit comes into contact with the surface of the PCB first, where the PCB is connected to the PTH. As soon as the contact occurs, the surface of the PCB, the backdrilling device, and the backdrill bit form a conductive loop, at which time the calculation of the first preset depth begins.

S102. After completion of the first backdrilling, withdraw a backdrill bit until the backdrill bit is electrically disconnected from the conductive layer.

Here it should be noted that, when the first backdrilling is complete, the conductive layer is already drilled through, that is, the backdrill bit has passed through the conductive layer. However, the calculation of the depth of the second backdrilling starts from the conductive layer, and a criterion for determining arrival of the backdrill bit at the conductive layer is an occasion on which the backdrill bit, the backdrilling device and the conductive layer form the conductive loop. Therefore, after the first backdrilling is complete, the drill bit needs to be withdrawn. A distance of the withdrawal may have multiple different options. For example, the drill bit is withdrawn out of a drill hole on the PCB directly, or withdrawn for only a specific distance. However, no matter how the drill bit is withdrawn, a prerequisite is that the backdrill bit must be at least withdrawn out of a space between the conductive layer and the target signal layer, so that the backdrill bit and the conductive layer are no longer in physical contact or cannot be electrically connected.

S103. Control the backdrill bit to move along the drill hole formed in the first backdrilling toward the target signal layer, and detect whether the backdrill bit is in contact with the conductive layer.

That is, after the backdrill bit is separated from the conductive layer, the backdrill bit is pushed along the drill hole toward the target signal layer again, and detection is performed to check whether the backdrill bit is in contact with the conductive layer while being pushed toward the target signal layer. A specific manner of detecting whether the backdrill bit is in contact with the conductive layer may be:

when detecting that a conductive loop is formed by the conductive layer, a backdrilling device, and the backdrill bit, determining that the backdrill bit is in contact with the conductive layer.

When it is ready to perform the second backdrilling, that is, when the backdrill bit is withdrawn and then pushed toward the target signal layer again, the conductive layer is electrically connected to the backdrilling device by means of a connection wire. It should be noted that, different from the first backdrilling, the contact of the backdrill bit with the conductive layer here primarily means that the drill rod part instead of the drill tip part of the backdrill bit is in contact with the conductive layer. After the first backdrilling, the backdrilling hole has passed through the conductive layer but the diameter of the backdrilling hole is the same as the diameter of the drill rod part of the backdrill bit. Therefore, in the second backdrilling, the drill tip part of the backdrill bit is theoretically unable to be in contact with the conductive layer. As soon as the drill rod of the backdrill bit comes into contact with the conductive layer, the conductive layer, the backdrilling device, and the backdrill bit form a conductive loop. The occasion of forming the conductive loop represents the exact time when the backdrill bit touches the conductive layer, that is, the time of starting to calculate a second preset depth.

S104. When the backdrill bit contacts the conductive layer, complete a second backdrilling with a second preset depth so that the target signal layer is not drilled through in the second backdrilling.

Preferably, the second preset depth is specifically a result of subtracting a thickness tolerance of a second distance and the backdrilling device tolerance from the second distance, where the second distance is between a connection location of the conductive layer and the PTH and a connection location of the target signal layer and the PTH, and the second distance is at least a sum of a thickness tolerance of a first distance and the backdrilling device tolerance, where the first distance is between the connection location of the conductive layer and the PTH and a connection location of the surface of the PCB and the PTH.

That is, a demarcated start location of the second backdrilling is on the conductive layer. After the backdrill bit is in contact with the conductive layer, it means that the second backdrilling may begin according to the second preset depth. The objective of the second backdrilling is to complete backdrilling precision of this backdrilling task, that is, to decide how many mils of the PTH length remain outside the target signal layer at most by means of the backdrilling. Therefore, the setting of the second preset depth in the second backdrilling needs to accomplish backdrilling precision of the backdrilling task but not to drill through the target signal layer. Refer to the following table, which lists maximum lengths of futile stub lengths allowed by PCBs of different signal rates, and recommended maximum lengths.

| Signal rate (Gbps) | Allowed maximum length (mil) | Recommended maximum length (mil) |
| --- | --- | --- |
| 2.5 | 160 | 160 |
| 3.125 | 130 | 130 |
| 5 | 75 | 60 |
| 6.25 | 60 | 50 |
| 10 | 40 | 30 |
| 12.5 | 30 | 20 |
| 16 | 25 | 15 |
| 25 | 15 | 10 |

The actual objective of the backdrilling is to minimize the futile stub length of the PTH that remains outside the target signal layer. A shorter futile stub means less impact on signal transmission of the PCB. Therefore, in theory, an expected value of each backdrilling has a maximum value, that is, the maximum allowed length of the futile stub, and a lower limit value is theoretically 0. In other words, the target signal layer is approached as close as possible but the target signal layer is not drilled through. Therefore, the backdrilling precision here primarily has a direct relationship with the thickness tolerance of the distance in the second backdrilling, and the working precision of the backdrilling device, or in other words, a backdrilling device tolerance. In a case in which the working tolerance of the backdrilling device is definite, an effective means of improving the backdrilling precision is to minimize the thickness tolerance of the PCB. On a prerequisite that the processing technology of the PCB is not changed, shortening only the backdrilling depth of the backdrilling, especially, shortening the backdrilling depth of the last backdrilling of the entire backdrilling operation, makes a great contribution to improvement of the backdrilling precision of the entire backdrilling. That is, a closer distance between the start location of the second backdrilling and the target signal layer leads to less impact on the backdrilling operation caused by the thickness tolerance, and accomplishes higher backdrilling precision.

Figure 2:
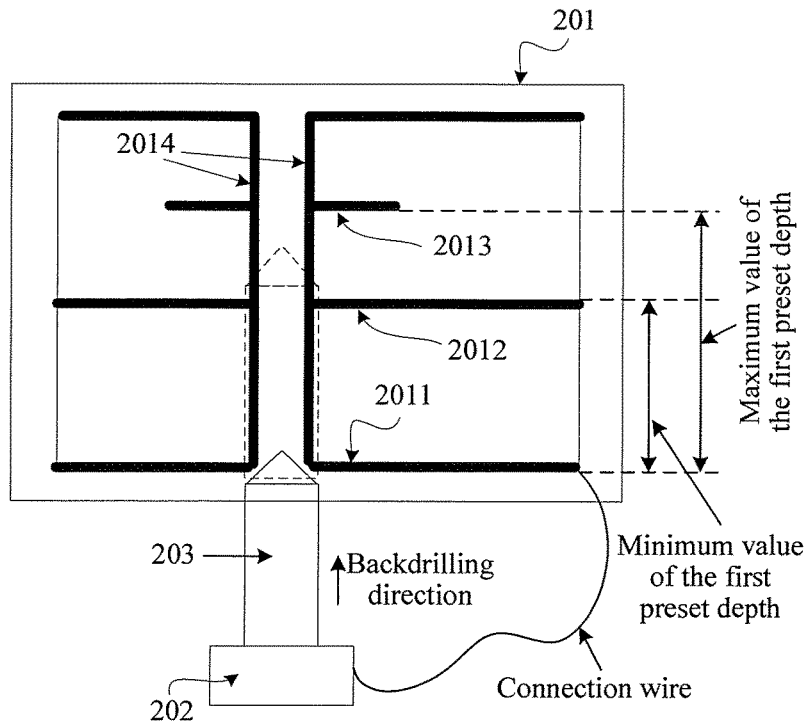
FIG. 2 is a schematic diagram of a system structure of a depth control system for a first backdrilling according to the present invention.

Here the first backdrilling is described by using a practical working scenario. Refer to FIG. 2, which is a schematic diagram of a system structure of a depth control system for a first backdrilling according to the present invention, where the system includes a PCB 201, a backdrilling device 202, and a backdrill bit 203.

The PCB 201 includes the surface 2011 of the PCB on the intended-for-backdrilling side, the conductive layer 2012, the target signal layer 2013, and the PTH 2014.

It can be seen that the backdrilling device 202 drives the backdrill bit 203 to perform the first backdrilling on the PTH 2014, where the first backdrilling starts from the surface 2011 of the PCB on the intended-for-backdrilling side. When the drill tip part at the front end of the backdrill bit is in contact with the surface 2011 of the PCB, the backdrilling device 202, the backdrill bit 203, and the surface 2011 of the PCB on the intended-for-backdrilling side form a conductive loop by means of a connection wire. The backdrilling device 202 uses generation of an electric current signal in the conductive loop as a time for starting the first backdrilling with the first preset depth, where a value range of the first preset depth is shown in the figure. A maximum value thereof is from a lower surface of the PCB on the intended-for-backdrilling side to a lower surface of the signal layer, that is, the signal layer is exactly not drilled through; and a minimum value thereof is from the lower surface of the PCB on the intended-for-backdrilling side to an upper surface of the conductive layer, that is, the conductive layer is exactly drilled through. After the backdrill bit 203 is controlled to perform the backdrilling operation with the first preset depth, the drill hole formed in the first backdrilling accomplishes an effect of drilling through the conductive layer 2012 but not drilling through the target signal layer 2013.

Figure 3:
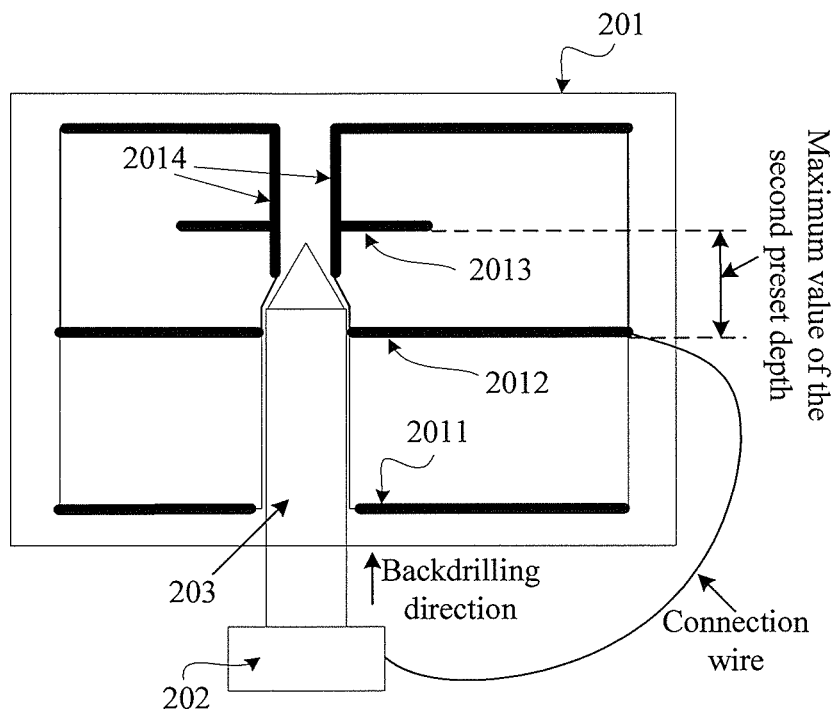
FIG. 3 is a schematic diagram of a system structure of a depth control system for a second backdrilling according to the present invention.

For the second backdrilling, refer to FIG. 3, which is a schematic diagram of a system structure of a depth control system for a second backdrilling according to the present invention, where the system includes a PCB 201, a backdrilling device 202, and a backdrill bit 203.

The PCB 201 includes the surface 2011 of the PCB on the intended-for-backdrilling side, the conductive layer 2012, the target signal layer 2013, and the PTH 2014.

When the second backdrilling is performed on the PTH 2014, the start time of calculating the second preset depth is the time when the drill rod part of the backdrill bit 203 is just in contact with the conductive layer 2012. At this time, the backdrilling device 202, the backdrill bit 203, and the conductive layer 2012 form a conductive loop by means of a connection wire. The backdrilling device 202 uses generation of an electric current signal in the conductive loop as the time for starting the second backdrilling with the second preset depth. Certainly, a maximum value of the second preset depth is a distance between the lower surface of the conductive layer and the lower surface of the signal layer, that is, the PTH part that needs to be removed on the signal layer is removed exactly without drilling through the signal layer. That is, the second preset depth is not a fixed value, and also floats to some extent depending on requirements of the backdrilling task, and a minimum value thereof is the maximum value minus the allowed maximum futile stub length of the backdrilling task. After the backdrill bit 203 is controlled to perform the backdrilling operation with the second preset depth, the drill hole formed in the second backdrilling accomplishes an effect of the backdrilling precision of the backdrilling task but without drilling through the target signal layer 2013.

It can be seen from this embodiment that, on one hand, a conductive layer connected to the PTH is disposed in the PCB; when a backdrilling operation is performed on the PTH, the backdrilling is performed twice, where the first backdrilling drills through the conductive layer but does not drill through the target signal layer, and the second backdrilling is performed toward the target signal layer by starting from the conductive layer that is closer to the target signal layer than the surface of the PCB until the entire backdrilling operation is complete. The backdrilling manner of two-time of backdrilling enables the backdrilling depth in the second backdrilling to be smaller than the backdrilling depth required in an original one-time backdrilling. Therefore, impact on the backdrilling operation caused by a thickness tolerance of the PCB is mitigated, and backdrilling precision of the backdrilling operation is improved.

On the other hand, the time of generating an electrical signal in the conductive loop formed in each of two backdrillings is used as the start time of calculating the backdrilling depth, thereby controlling the backdrilling depth in the two backdrillings properly and effectively and further improving the backdrilling precision.

Embodiment 2

Figure 4:
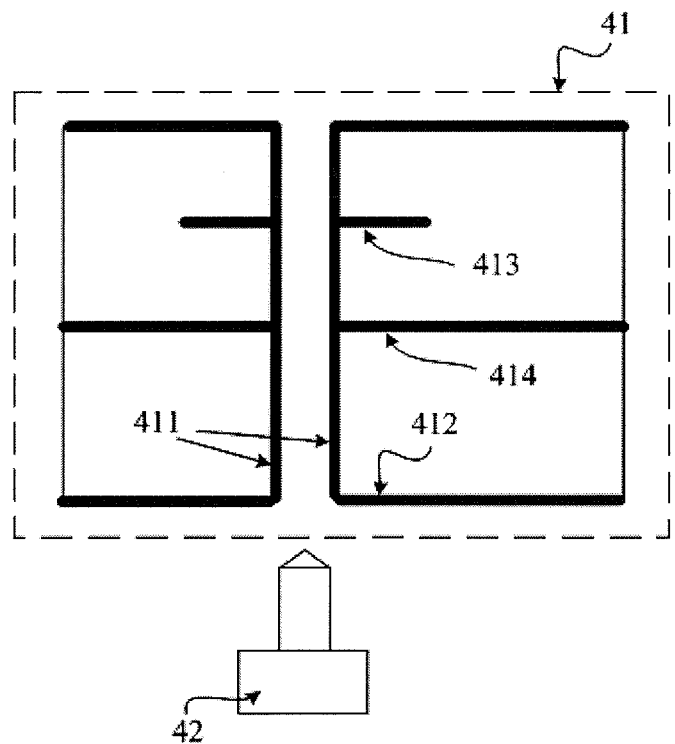
FIG. 4 is a schematic diagram of a system structure of a PCB backdrilling system according to the present invention.

Corresponding to the foregoing one PCB backdrilling method, this embodiment of the present invention further provides a PCB backdrilling system. Refer to FIG. 4, which is a schematic diagram of a system structure of a PCB backdrilling system according to the present invention, where a conductive layer is disposed between a surface of a PCB on an intended-for-backdrilling side of a PTH and a target signal layer of the PCB, the conductive layer is connected to the PTH, and the target signal layer is a signal layer corresponding to a current backdrilling task, and the system includes the PCB 41 and a backdrilling device 42. The following further describes an internal structure and a connection relationship of the system with reference to working principles of the system.

The PCB 41 includes the PTH 411, the surface 412 of the PCB on the intended-for-backdrilling side of the PTH, the target signal layer 413, and the conductive layer 414.

The surface 412 of the PCB on the intended-for-backdrilling side of the PTH, the target signal layer 413, and the conductive layer 414 are all connected to the PTH 411.

The backdrilling device 42 is configured to perform a first backdrilling on the PTH 411 with a first preset depth starting from the surface 412 of the PCB on the intended-for-backdrilling side of the PTH, so that a drill hole formed in the first backdrilling passes through the conductive layer 414 and does not pass through the target signal layer 413; after completion of the first backdrilling, withdraw a backdrill bit until the backdrill bit is electrically disconnected from the conductive layer 414; control the backdrill bit to move along the drill hole toward the target signal layer 413, and detect whether the backdrill bit is in contact with the conductive layer 414; and when the backdrill bit is in contact with the conductive layer 414, complete a second backdrilling with a second preset depth starting from the conductive layer 414, so that the target signal layer 413 is not drilled through in the second backdrilling.

Preferably, the first preset depth is specifically any value that is greater than a sum of a first distance, a thickness tolerance of the first distance, and the backdrilling device tolerance, where the first distance is between a connection location of the conductive layer and the PTH and a connection location of the surface of the PCB and the PTH, but is smaller than a difference between a total distance and a sum of a thickness tolerance of the total distance and the backdrilling device tolerance, where the total distance is between a connection location of the target signal layer and the PTH and the connection location of the surface of the PCB and the PTH.

Preferably, the second preset depth is specifically a result of subtracting a thickness tolerance of a second distance and the backdrilling device tolerance from the second distance, where the second distance is between a connection location of the conductive layer and the PTH and a connection location of the target signal layer and the PTH, and the second distance is at least a sum of a thickness tolerance of a first distance and the backdrilling device tolerance, where the first distance is between the connection location of the conductive layer and the PTH and a connection location of the surface of the PCB and the PTH.

Preferably, the conductive layer is specifically a ground layer or a power layer or another signal layer of the PCB.

Preferably, the detecting whether the backdrill bit is in contact with the conductive layer is specifically:

when detecting that a conductive loop is formed by the conductive layer, a backdrilling device, and the backdrill bit, determining that the backdrill bit is in contact with the conductive layer.

It can be seen from the foregoing embodiment that, on one hand, a conductive layer connected to the PTH is disposed in the PCB; when a backdrilling operation is performed on the PTH, the backdrilling is performed twice, where the first backdrilling drills through the conductive layer but does not drill through the target signal layer, and the second backdrilling is performed toward the target signal layer by starting from the conductive layer that is closer to the target signal layer than the surface of the PCB until the entire backdrilling operation is complete. The backdrilling manner of the two-time backdrilling enables the backdrilling depth in the second backdrilling to be smaller than the backdrilling depth required in an original one-time backdrilling. Therefore, impact on the backdrilling operation caused by a thickness tolerance of the PCB is mitigated, and backdrilling precision of the backdrilling operation is improved.

On the other hand, the time of generating an electrical signal in the conductive loop formed in each of the two backdrillings is used as the start time of calculating the backdrilling depth, thereby controlling the backdrilling depth in the two backdrillings properly and effectively and further improving the backdrilling precision.

It should be noted that a person of ordinary skill in the art may understand that all or a part of the processes of the methods in the embodiments may be implemented by a computer program instructing relevant hardware. The program may be stored in a computer readable storage medium. When the program runs, the processes of the methods in the embodiments are performed. The foregoing storage medium may include: a magnetic disk, an optical disc, a read-only memory (Read-Only Memory, ROM), or a random access memory (Random Access Memory, RAM).

The foregoing has described in detail a PCB backdrilling method and system provided in the embodiments of the present invention. Specific embodiments are used in this specification to describe the principle and implementation manners of the present invention. The foregoing embodiments are merely intended to help understand the method and core idea of the present invention. In addition, with respect to the implementation manners and the application scope, modifications may be made by a person of ordinary skill in the art according to the idea of the present invention. Therefore, the specification shall not be construed as a limitation on the present invention.

What is claimed is:

1. A printed circuit board (PCB) backdrilling method, wherein a conductive layer is disposed between a surface of a PCB on an intended-for-backdrilling side of a plated through hole (PTH) and a target signal layer of the PCB, the conductive layer is connected to the PHT, and the target signal layer is a signal layer corresponding to a current backdrilling task, and the method comprises;

performing a first backdrilling on the PTH with a first preset depth starting from the surface of the PCB on the intended-for-backdrilling side of the PTH, so that a drill hole formed in the first backdrilling passes through the conductive layer and does not pass through the target signal layer;

after completion of the first backdrilling, withdrawing a backdrill bit until the backdrill bit is electrically disconnected from the conductive layer;

controlling the backdrill bit to move along the drill hole formed in the first backdrilling toward the target signal layer, and detecting whether the backdrill bit is in contact with the conductive layer; and when the backdrill bit is in contact with the conductive layer, completing a second backdrilling with a second preset depth starting from the conductive layer, so that the target signal layer is not drilled through in the second backdrilling.

2. The method according to claim 1, wherein the first preset depth has a value that is greater than a sum of a first distance, a thickness tolerance of the first distance, and a backdrilling device tolerance, wherein the first distance is between a connection location of the conductive layer and the PTH and a connection location of the surface of the PCB and the PTH, but is smaller than a difference between of total distance and a sum of a thickness tolerance of the total distance and the backdrilling device tolerance, wherein the total distance is between a connection location of the target signal layer and the PTH and the connection location of the surface of the PCB and the PHT.

3. The method according to claim 1, wherein the second preset depth is a result of subtracting a thickness tolerance of a second distance and the backdrilling device tolerance from the second distance, wherein the second distance is between a connection location of the conductive layer and the PTH and a connection location of the target signal layer and the PTH, and the second distance is at least a sum of a thickness tolerance of a first distance and a backdrilling device tolerance, wherein the first distance is between the connection location of the conductive layer and the PTH and a connection location of the surface of the PCB and the PTH.

4. The method according to claim 1, wherein the conductive layer is a ground layer or a power layer or another signal layer of the PCB.

5. The method according to claim 1, wherein detecting whether the backdrill bit is in contact with the conductive layer comprises:

detecting whether a conductive loop is formed by the conductive layer, backdrilling device, and the backdrill bit.

6. The method according to claim 1, wherein performing a first backdrilling on the PTH with a first preset depth starting from the surface of the PCB on the intended-for-backdrilling side of the PTH comprises;

when the backdrill bit is in contact with the surface of the PCB on the intended-for-backdrilling side of the PTH, forming a conductive loop by the surface of the PCB on the intended-for-backdrilling side of the PHT, a backdrilling device and the backdrill bit; and when detecting that the surface of the PCB on the intended-for-backdrilling side of the PTH, the backdrilling device, and the backdrill bit form the conductive loop, completing the first backdrilling on the PTH with the first preset depth starting from the surface of the PCB on the intended-for-backdrilling side of the PTH.

* * * * *